United States Patent
Sahara et al.

(10) Patent No.: US 12,248,161 B2
(45) Date of Patent: Mar. 11, 2025

(54) OPTICAL FILTER AND METHOD FOR MANUFACTURING SAME

(71) Applicant: NIPPON ELECTRIC GLASS CO., LTD., Otsu (JP)

(72) Inventors: Keiichi Sahara, Otsu (JP); Masaaki Imura, Otsu (JP); Takako Tojo, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 472 days.

(21) Appl. No.: 17/775,412

(22) PCT Filed: Dec. 3, 2020

(86) PCT No.: PCT/JP2020/045056
§ 371 (c)(1),
(2) Date: May 9, 2022

(87) PCT Pub. No.: WO2021/117598
PCT Pub. Date: Jun. 17, 2021

(65) Prior Publication Data
US 2022/0381962 A1  Dec. 1, 2022

(30) Foreign Application Priority Data

Dec. 11, 2019 (JP) .................. 2019-223922
Dec. 11, 2019 (JP) .................. 2019-223923

(51) Int. Cl.
| | | |
|---|---|---|
| G02B 5/28 | (2006.01) | |
| C03C 17/22 | (2006.01) | |
| C03C 17/34 | (2006.01) | |
| C23C 14/00 | (2006.01) | |

(Continued)

(52) U.S. Cl.
CPC .......... *G02B 5/285* (2013.01); *C03C 17/22* (2013.01); *C03C 17/3482* (2013.01);
(Continued)

(58) Field of Classification Search
CPC ........ G02B 5/285; G02B 1/113; G02B 5/281; C03C 17/3482; C03C 2217/734
(Continued)

(56) References Cited

U.S. PATENT DOCUMENTS

| | | | |
|---|---|---|---|
| 5,398,133 A | 3/1995 | Tsai et al. | |
| 7,901,870 B1 * | 3/2011 | Wach | G02B 5/28 430/321 |

(Continued)

FOREIGN PATENT DOCUMENTS

| | | |
|---|---|---|
| CN | 107850713 A | 3/2018 |
| CN | 109975905 A | 7/2019 |

(Continued)

OTHER PUBLICATIONS

Official Communication issued in International Patent Application No. PCT/JP2020/045056, mailed on Jan. 12, 2021.
(Continued)

*Primary Examiner* — Charles S Chang
(74) *Attorney, Agent, or Firm* — Keating & Bennett, LLP

(57) ABSTRACT

Provided is an optical filter capable of reducing the dependency on the angle of light incidence. An optical filter 1 includes a hydrogenated silicon-containing film 4, wherein in a Raman spectrum of the hydrogenated silicon-containing film 4 measured by Raman spectroscopy a ratio (SiH/SiH$_2$) obtained from a ratio between an area of a peak derived from SiH and an area of a peak derived from SiH$_2$ is 0.7 or more.

6 Claims, 3 Drawing Sheets

(51) Int. Cl.
   *C23C 14/10*   (2006.01)
   *C23C 14/18*   (2006.01)
   *C23C 14/34*   (2006.01)
   *C23C 14/58*   (2006.01)
   *G02B 1/113*   (2015.01)

(52) U.S. Cl.
   CPC .......... *C23C 14/0036* (2013.01); *C23C 14/10* (2013.01); *C23C 14/185* (2013.01); *C23C 14/34* (2013.01); *C23C 14/5846* (2013.01); *G02B 1/113* (2013.01); *C03C 2217/734* (2013.01); *C03C 2218/154* (2013.01); *C03C 2218/155* (2013.01); *G02B 5/281* (2013.01)

(58) Field of Classification Search
   USPC ........................................................ 430/321
   See application file for complete search history.

(56) References Cited

U.S. PATENT DOCUMENTS

2018/0136380 A1   5/2018   Tatemura
2019/0352222 A1   11/2019  Zhang et al.

FOREIGN PATENT DOCUMENTS

KR   10-1587643 B1      1/2016
WO   2019/085265 A1     5/2019

OTHER PUBLICATIONS

Official Communication issued in Chinese Patent Application No. 202080066290.3, mailed on Nov. 8, 2023.

* cited by examiner

[FIG. 1]
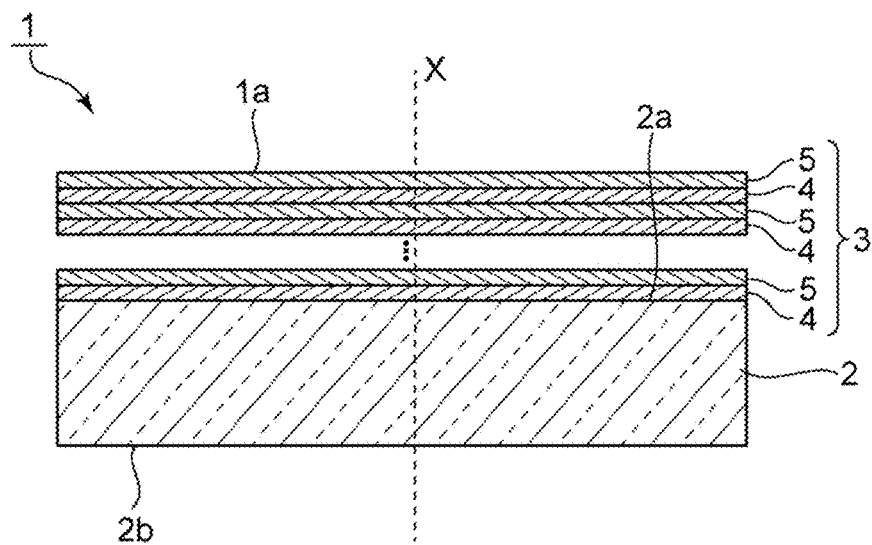
[FIG. 2]
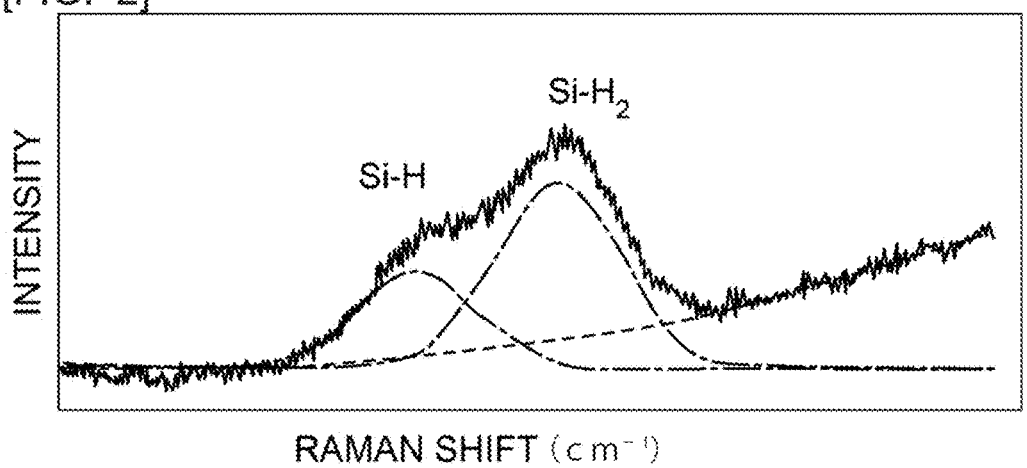
[FIG. 3]
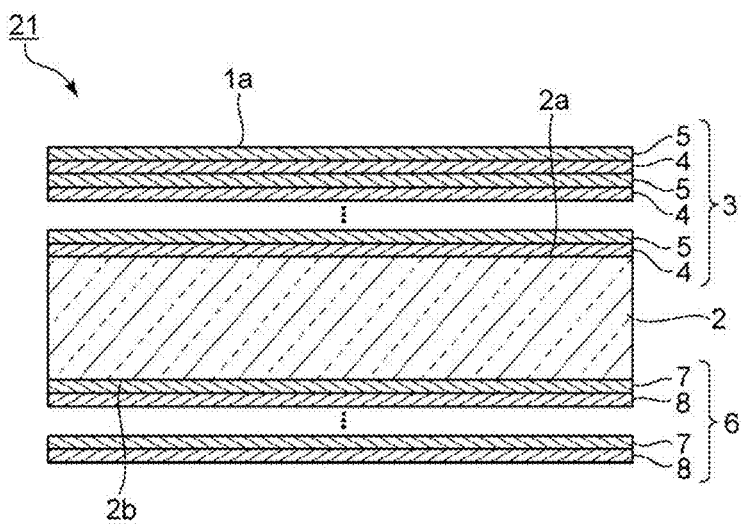

[FIG. 4]
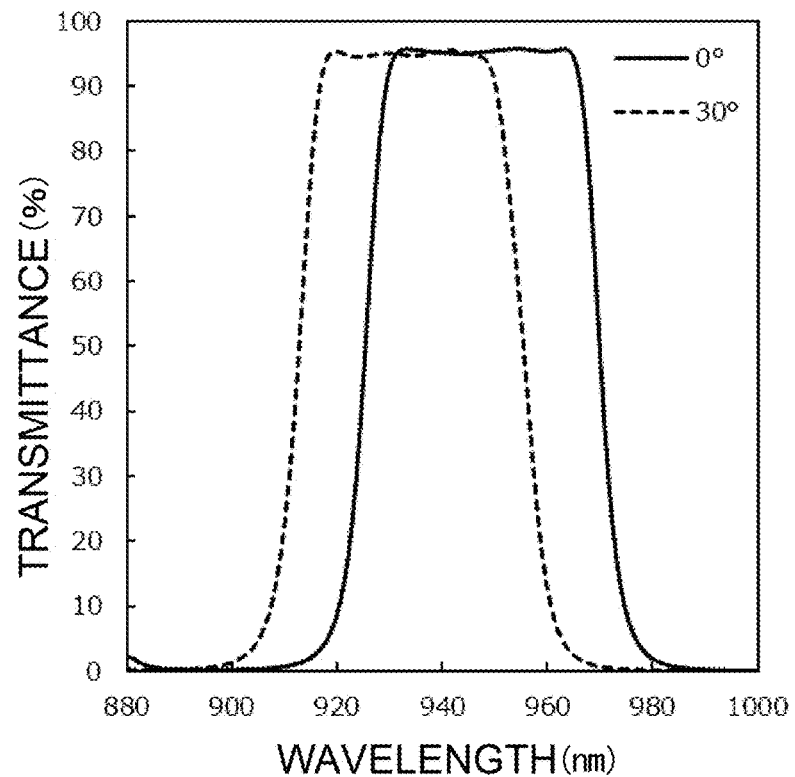
[FIG. 5]
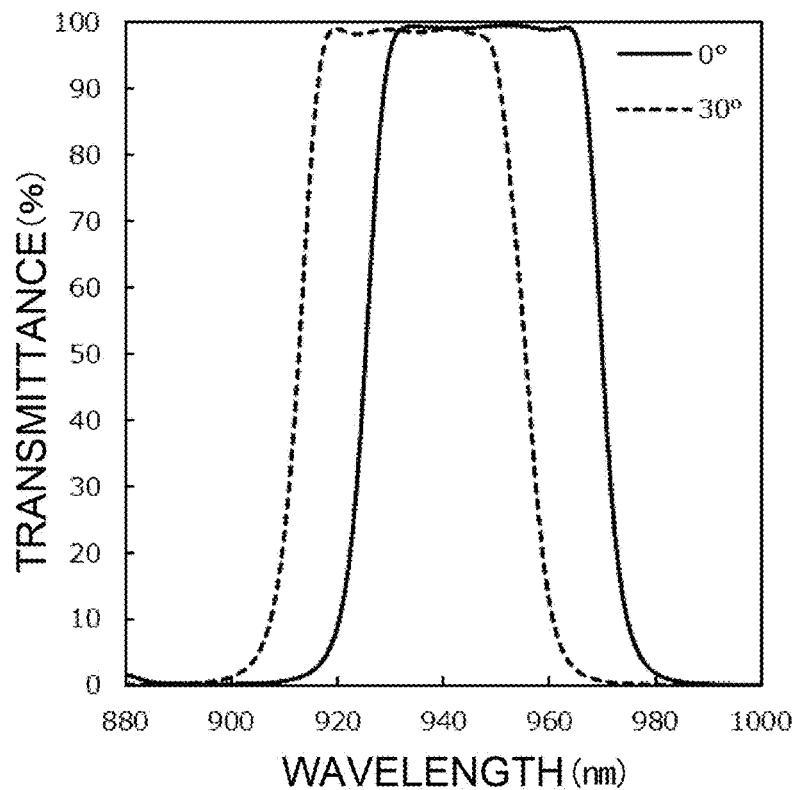

[FIG. 6]
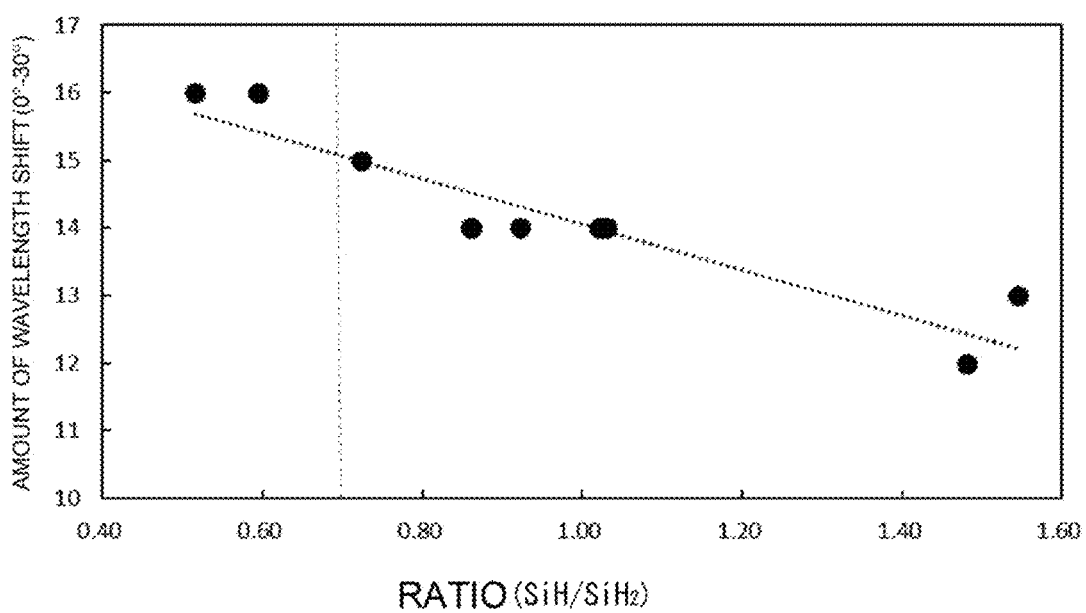
[FIG. 7]
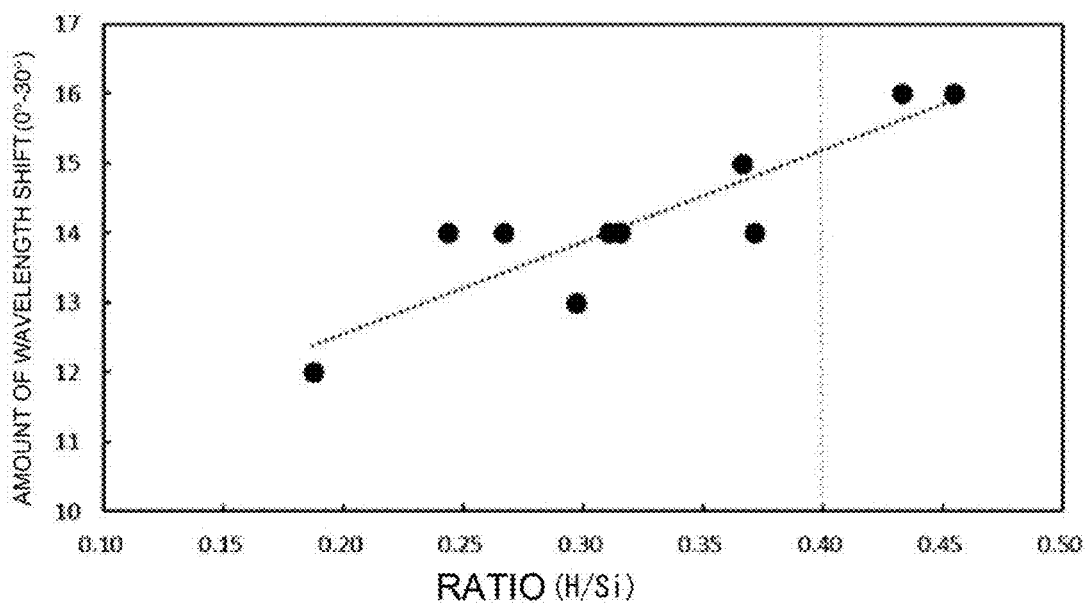

OPTICAL FILTER AND METHOD FOR MANUFACTURING SAME

TECHNICAL FIELD

The present invention relates to optical filters capable of selectively transmitting light in a specific wavelength range and methods for manufacturing the optical filters.

BACKGROUND ART

Optical filters capable of selectively transmitting light in a specific wavelength range are conventionally widely used in infrared sensors and other applications. As an example of such an optical filter, there is known a bandpass filter in which a multi-layer is used. An example of the multi-layer used is a layered film in which high-refractive index films having a relatively high refractive index and low-refractive index films having a relatively low refractive index are alternately repeatedly layered (for example, Patent Literature 1). Patent Literature 1 describes hydrogenated silicon as a high-refractive index film. Patent Literature 1 also describes silicon nitride as a low-refractive index film. Patent Literature 1 describes that a hydrogenated silicon film is formed by deposition by plasma CVD (PECVD) using silane gas.

CITATION LIST

Patent Literature

[PTL 1]
U.S. Pat. No. 5,398,133

SUMMARY OF INVENTION

Technical Problem

Recently, with the development of self-driving technology, it is being considered to equip automotive vehicles with a large number of sensors, including a laser radar, particularly, a sensor called a LiDAR (light detection and ranging) capable of detecting an object by laser light. Such a sensor is required to selectively transmit light, particularly, in a specific near-infrared wavelength range and further advance its performance.

Particularly, an optical filter in which a multi-layer is used has a problem that when the angle of incidence of light (the angle of light to a straight line perpendicular to a principal surface of the optical filter) increases, the passband (transmission band) shifts to shorter wavelengths. This presents a problem that the optical filter cannot sufficiently transmit light having a large angle of incidence. The optical filter in Patent Literature 1 also cannot sufficiently reduce this dependency on the angle of incidence.

An object of the present invention is to provide an optical filter capable of reducing the dependency on the angle of light incidence and a method for manufacturing the optical filter.

Solution to Problem

An optical filter according to a first aspect of the invention of the present application is an optical filter including a hydrogenated silicon-containing film, wherein in a Raman spectrum of the hydrogenated silicon-containing film measured by Raman spectroscopy a ratio (SiH/SiH$_2$) obtained from a ratio between an area of a peak derived from SiH and an area of a peak derived from SiH$_2$ is 0.7 or more.

In an optical filter according to a second aspect of the invention of the present application, a ratio (H/Si) between a content of hydrogen atoms in the hydrogenated silicon-containing film measured by hydrogen forward scattering spectroscopy and a content of silicon atoms in the hydrogenated silicon-containing film measured by Rutherford backscattering spectroscopy is 0.4 or less.

Hereinafter, the first aspect and the second aspect of the invention of the present application may be referred to collectively as the present invention.

In the present invention, it is preferred that the optical filter includes: a transparent substrate; and a filter portion provided on one of both principal surfaces of the transparent substrate and made of a multi-layer including a high-refractive index film with a relatively high refractive index and a low-refractive index film with a relatively low refractive index, and that the high-refractive index film is the hydrogenated silicon-containing film.

In the present invention, the low-refractive index film is preferably a silicon oxide-containing film.

In the present invention, the optical filter preferably further includes an antireflection film provided on the other principal surface of the transparent substrate and containing hydrogenated silicon.

A method for manufacturing an optical filter according to another aspect of the invention of the present application is a method for manufacturing the optical filter structured in accordance with the present invention and includes the steps of: depositing a silicon film by sputtering; and hydrogenating the silicon film after the step of depositing the silicon film.

Advantageous Effects of Invention

The present invention enables provision of an optical filter capable of reducing the dependency on the angle of light incidence and a method for manufacturing the optical filter.

BRIEF DESCRIPTION OF DRAWINGS

FIG. 1 is a schematic cross-sectional view showing an optical filter according to a first embodiment of the present invention.

FIG. 2 is a graph for illustrating how to determine the area of a SiH-derived peak and the area of a SiH$_2$-derived peak in a Raman spectrum.

FIG. 3 is a schematic cross-sectional view showing an optical filter according to a second embodiment of the present invention.

FIG. 4 is a graph showing a bandpass filter characteristic of a first optical filter obtained in Example 1.

FIG. 5 is a graph showing a bandpass filter characteristic of a second optical filter obtained in Example 1.

FIG. 6 is a graph showing the relationship between the ratio (SiH/SiH$_2$) and the amount of shift of a central wavelength of a transmission band.

FIG. 7 is a graph showing the relationship between the ratio (H/Si) of the content of hydrogen atoms to the content of silicon atoms in a hydrogenated silicon film and the amount of shift of a central wavelength of a transmission band.

DESCRIPTION OF EMBODIMENTS

Hereinafter, a description will be given of preferred embodiments. However, the following embodiments are merely illustrative and the present invention is not limited to the following embodiments. Throughout the drawings, members having substantially the same functions may be referred to by the same reference characters.

First Embodiment (Optical Filter)

FIG. 1 is a schematic cross-sectional view showing an optical filter according to a first embodiment of the present invention. As shown in FIG. 1, an optical filter 1 includes a transparent substrate 2 and a filter portion 3.

The shape of the transparent substrate 2 is not particularly limited, but is a rectangular plate-like shape in this embodiment. The thickness of the transparent substrate 2 may be, for example, not less than 30 μm and not more than 2 mm.

The transparent substrate 2 is preferably a substrate transparent in a wavelength range for use in the optical filter 1. The material for the transparent substrate 2 is not particularly limited and examples include glass and resin. So long as the wavelength range for use in the optical filter 1 is an infrared range, the material may be Si, Ge or the like. Examples of the glass include soda-lime glass, borosilicate glass, alkali-free glass, crystallized glass, and quartz glass. Alternatively, the glass may be aluminosilicate glass for use as strengthened glass.

The transparent substrate 2 has a first principal surface 2a and a second principal surface 2b opposed to each other. A filter portion 3 is provided on the first principal surface 2a of the transparent substrate 2.

The filter portion 3 is a multi-layer including high-refractive index films 4 with a relatively high refractive index and low-refractive index films 5 with a relatively low refractive index. In this embodiment, the high-refractive index films 4 and the low-refractive index films 5 are provided alternately in this order on the first principal surface 2a of the transparent substrate 2, thus forming a multi-layer.

In this embodiment, the high-refractive index films 4 are made of hydrogenated silicon. The ratio ($SiH/SiH_2$) in the high-refractive index films 4 is 0.7 or more.

The ratio ($SiH/SiH_2$) can be determined from the ratio between the area of a SiH-derived peak and the area of a $SiH_2$-derived peak in a Raman spectrum of a hydrogenated silicon-containing film serving as the high-refractive index film 4 measured by Raman spectroscopy.

A Raman spectrum based on Raman spectroscopy can be measured, for example, with a micro-Raman spectroscope (Product Name "RAMANtouch" manufactured by Nanophoton Corporation). In the Raman spectrum, the peak derived from SiH appears nearly between 1980 $cm^{-1}$ and 2000 $cm^{-1}$. The peak derived from $SiH_2$ appears nearly between 2090 $cm^{-1}$ and 2100 $cm^{-1}$. Therefore, as shown in FIG. 2, the peak area of each of the peak derived from SiH and the peak derived from $SiH_2$ can be determined by subjecting each peak to peak fitting processing using Gaussian function and BWF (Breit-Wigner-Fano) function. The peak fitting processing can be executed, for example, using spectral analysis software (Product Name "RAMAN Viewer" manufactured by Nanophoton Corporation).

The low-refractive index films 5 are made of silicon oxide. However, the low-refractive index films 5 may be made of aluminum oxide, titanium oxide, niobium oxide, tantalum oxide, zirconium oxide, tin oxide, silicon nitride or so on.

The thickness of the high-refractive index film 4 per layer is not particularly limited, but is preferably not less than 10 nm, more preferably not less than 20 nm, preferably not more than 1000 nm, and more preferably not more than 750 nm.

The thickness of the low-refractive index film 5 per layer is not particularly limited, but is preferably not less than 10 nm, more preferably not less than 20 nm, preferably not more than 500 nm, and more preferably not more than 300 nm.

The number of layers constituting the multi-layer in the filter portion 3 is preferably not less than 16, more preferably not less than 20, preferably not more than 50, and more preferably not more than 40.

The optical filter 1 according to this embodiment is a bandpass filter designed to selectively transmit light in a specific wavelength range by optical interference by including the filter portion 3 made of the above multi-layer. In this embodiment, the optical filter 1 is designed so that the central wavelength of a passband (transmission band) at an angle of incidence of light of 0° is 800 nm to 1000 nm. However, the central wavelength of the transmission band at an angle of incidence of light of 0° may be outside of the range of 800 nm to 1000 nm. The term angle of incidence here refers to the angle of light to a straight line perpendicular to the principal surface 1a of the optical filter 1 (the line X shown in FIG. 1).

Furthermore, a first feature of the optical filter 1 according to this embodiment is that when the hydrogenated silicon-containing film serving as the high-refractive index film 4 in the filter portion 3 is measured in terms of Raman spectrum, the ratio ($SiH/SiH_2$) is 0.7 or more. Thus, the high-refractive index film 4 can be made into a dense film. Even when the angle of incidence of light is larger than 0°, the shift of the central wavelength of the transmission band to a shorter wavelength can be reduced and, therefore, the dependency on the angle of light incidence can be reduced. Hence, the optical filter 1 can sufficiently transmit even light having a large angle of incidence.

From the viewpoint of further reducing the dependency on the angle of light incidence, the ratio ($SiH/SiH_2$) in the hydrogenated silicon-containing film is preferably 1.0 or more and more preferably 1.3 or more. The upper limit of the ratio ($SiH/SiH_2$) in the hydrogenated silicon film is not particularly limited, but may be, for example, 1.6.

A second feature of the optical filter 1 according to this embodiment is that the ratio (H/Si) between the content of hydrogen atoms and the content of silicon atoms in the hydrogenated silicon-containing film serving as the high-refractive index film 4 in the filter portion 3 is 0.4 or less. Thus, the high-refractive index film 4 can be made into a dense film. Even when the angle of incidence of light is larger than 0°, the shift of the central wavelength of the transmission band to a shorter wavelength can be reduced and, therefore, the dependency on the angle of light incidence can be reduced. Hence, the optical filter 1 can sufficiently transmit even light having a large angle of incidence.

The ratio (H/Si) between the content of hydrogen atoms and the content of silicon atoms in the hydrogenated silicon-containing film serving as the high-refractive index film 4 is 0.4 or less, preferably 0.35 or less, and more preferably 0.3 or less. In this case, the high-refractive index film 4 can be made into a denser film. Even when the angle of incidence of light is larger than 0°, the shift of the central wavelength of the transmission band to a shorter wavelength can be further reduced and, therefore, the dependency on the angle of light incidence can be further reduced. Hence, the optical filter 1 can more sufficiently transmit even light having a large angle of incidence. The lower limit of the ratio (H/Si)

between the content of hydrogen atoms and the content of silicon atoms is not particularly limited, but may be, for example, 0.1.

The content of hydrogen atoms can be measured by hydrogen forward scattering spectroscopy (HFS). The content of silicon atoms can be measured by Rutherford backscattering spectroscopy (RBS). The analysis by hydrogen forward scattering spectroscopy and the analysis by Rutherford backscattering spectroscopy may be made concurrently.

The content of hydrogen atoms in the hydrogenated silicon-containing film is preferably not less than 5% by atom (at %), more preferably not less than 10% by atom (at %), preferably not more than 30% by atom (at %), and more preferably not more than 25% by atom (at %). In this case, the dependency on the angle of light incidence can be further reduced.

The content of silicon atoms in the hydrogenated silicon-containing film is preferably not less than 70% by atom (at %), more preferably not less than 75% by atom (at %), preferably not more than 95% by atom (at %), and more preferably not more than 90% by atom (at %). In this case, the dependency on the angle of light incidence can be further reduced.

Since the optical filter 1 according to this embodiment can reduce the dependency on the angle of light incidence even when the central wavelength of the transmission band at an angle of incidence of light of 0° is between 800 nm and 1000 nm, it can be suitably used particularly for sensor applications designed to set the central wavelength of a transmission band within a near-infrared range, such as a LiDAR.

The optical filter 1 according to this embodiment satisfies both the first feature that when the hydrogenated silicon-containing film serving as the high-refractive index film 4 is measured in terms of Raman spectrum, the ratio (SiH/SiH$_2$) is 0.7 or more, and the second feature that the ratio (H/Si) between the content of hydrogen atoms and the content of silicon atoms in the hydrogenated silicon-containing film serving as the high-refractive index film 4 is 0.4 or less. In the present invention, the optical filter may satisfy both the first feature and the second feature as just described or may satisfy only one of the first feature and the second feature. Therefore, in the present invention, it is sufficient that the optical filter satisfies, as for the hydrogenated silicon-containing film serving as the high-refractive index film 4, either that the ratio (SiH/SiH$_2$) is 0.7 or more, or that the ratio (H/Si) is 0.4 or less. In either case, the effect of the present invention enabling reduction of the dependency on the angle of light incidence can be obtained.

Hereinafter, a detailed description will be given of an example of a method for manufacturing an optical filter 1.

(Manufacturing Method of Optical Filter)

First, a transparent substrate 2 is prepared. Next, a filter portion 3 as a multi-layer is formed on the first principal surface 2a of the transparent substrate 2. The filter portion 3 can be formed by alternately layering high-refractive index films 4 and low-refractive index films 5 in this order on the first principal surface 2a of the transparent substrate 2. Each of the high-refractive index films 4 and the low-refractive index films 5 can be formed by sputtering.

Particularly, hydrogenated silicon-containing films serving as the high-refractive index films 4 are each preferably formed by depositing a silicon film and then hydrogenating the deposited silicon film. Specifically, the hydrogenated silicon-containing film is preferably formed by depositing a silicon film by sputtering and then hydrogenating the silicon film using RF plasma. Thus, the ratio (SiH/SiH$_2$) in the obtained hydrogenated silicon-containing film can be further increased. In addition, the ratio (H/Si) between the content of hydrogen atoms and the content of silicon atoms in the obtained hydrogenated silicon-containing film can be further decreased.

The temperature of the transparent substrate 2 (substrate) in depositing the high-refractive index films 4 is preferably 70° C. or higher and more preferably 100° C. or higher. In this case, the ratio (SiH/SiH$_2$) in the obtained hydrogenated silicon-containing film can be further increased. In addition, the ratio (H/Si) between the content of hydrogen atoms and the content of silicon atoms in the obtained hydrogenated silicon-containing film can be further decreased. The upper limit of the temperature of the transparent substrate 2 (substrate) in depositing the high-refractive index films 4 may be, for example, 300° C.

The above-described deposition of a silicon film can be performed, for example, using a silicon target and by setting the flow rate of an inert gas, such as argon gas, serving as a carrier gas at 100 sccm to 500 sccm and setting the power at 2 kW to 10 kW. The above-described hydrogenation of the silicon film can be performed, for example, by setting the flow rate of an inert gas, such as argon gas, serving as a carrier gas at 100 sccm to 500 sccm, the flow rate of hydrogen gas at 5 sccm to 200 sccm, and RF power at 1 kW to 5 kW.

The flow rate ratio (H$_2$/Ar) of hydrogen (H$_2$) gas to argon (Ar) gas is preferably 0.5 or less and more preferably 0.3 or less. In this case, the ratio (SiH/SiH$_2$) in the obtained hydrogenated silicon-containing film can be further increased. In addition, the ratio (H/Si) between the content of hydrogen atoms and the content of silicon atoms in the obtained hydrogenated silicon-containing film can be further decreased. The lower limit of the flow rate ratio (H$_2$/Ar) is not particularly limited, but may be, for example, 0.02.

In the manufacturing method according to this embodiment, the ratio (SiH/SiH$_2$) in the hydrogenated silicon-containing film can be controlled, for example, by controlling the deposition conditions of the high-refractive index films 4 by sputtering in the above manner. Furthermore, in the manufacturing method according to this embodiment, the ratio (H/Si) between the content of hydrogen atoms and the content of silicon atoms can be controlled, for example, by controlling the deposition conditions of the high-refractive index films 4 by sputtering in the above manner.

Second Embodiment

FIG. 3 is a schematic cross-sectional view showing an optical filter according to a second embodiment of the present invention. In an optical filter 21, an antireflection film 6 is provided on the second principal surface 2b of a transparent substrate 2. The rest is the same as in the first embodiment.

The antireflection film 6 is a multi-layer including high-refractive index films 7 with a relatively high refractive index and low-refractive index films 8 with a relatively low refractive index. In this embodiment, the high-refractive index films 7 and the low-refractive index films 8 are provided alternately in this order on the second principal surface 2b of the transparent substrate 2, thus forming a multi-layer. In this embodiment, the high-refractive index films 7 are made of hydrogenated silicon. The low-refractive index films 8 are made of silicon oxide. However, the material used for the high-refractive index films 7 and the low-refractive index films 8 may be aluminum oxide, tantalum oxide, niobium oxide, titanium oxide, hafnium oxide, silicon nitride, zirconium oxide or tin oxide. The number of layers constituting the multi-layer is preferably not less than 10 and preferably not more than 40.

Also in the optical filter 21 according to the second embodiment, when the hydrogenated silicon-containing film serving as the high-refractive index film 4 in the filter portion 3 is measured in terms of Raman spectrum, the ratio (SiH/SiH$_2$) is 0.7 or more. Furthermore, in the hydrogenated silicon-containing film serving as the high-refractive index film 4 in the filter portion 3, the ratio (H/Si) between the content of hydrogen atoms and the content of silicon atoms is 0.4 or less. Therefore, the shift of the central wavelength of the transmission band to a shorter wavelength can be reduced and, therefore, the dependency on the angle of light incidence can be reduced. In addition, since the optical filter 21 is provided with the antireflection film 6, the transmittance in the transmission band can be further increased.

In the present invention, an antireflection film other than the antireflection film 6 may be used, but preferably contains a hydrogenated silicon film as in the above embodiment. In this case, the transmittance in the transmission band can be further increased while the dependency on the angle of light incidence can be reduced.

Hereinafter, a description will be given in further detail of the present invention with reference to specific examples. The present invention is not at all limited by the following examples and can be embodied in appropriately modified forms without changing the gist of the invention.

Example 1

First, a glass substrate was prepared as a transparent substrate. Next, a target of silicon was sputtered using argon (Ar) gas as a carrier gas, thus depositing a silicon film on one principal surface of the glass substrate. In doing so, the flow rate of argon gas was set at 150 sccm. The power applied to the target (deposition power) was set at 10 kW. Next, the silicon film was hydrogenated using both hydrogen (H$_2$) gas and argon (Ar) gas as a carrier gas and using RF plasma, thus forming a hydrogenated silicon film. In doing so, the flow rate of hydrogen (H$_2$) gas was set at 50 sccm and the flow rate of argon gas was set at 200 sccm. The power applied to the RF plasma was set at 2.5 kW.

Next, a target of silicon was sputtered using both argon gas and oxygen gas as a carrier gas, thus depositing a silicon oxide (SiO$_2$) film on the hydrogenated silicon film. In doing so, the flow rate of argon gas was set at 150 sccm and the flow rate of oxygen gas was set at 15 sccm. The power applied to the target was set at 10 kW. During the deposition, the substrate temperature was held at 270° C. By repeating the above operation, a filter portion was formed in which hydrogenated silicon films and SiO$_2$ films were layered alternately, one layer after another, on the glass substrate and which was composed of 28 layers in total. Thus, a first optical filter designed to function as a bandpass filter and have a central wavelength of 940 nm in a transmission band was obtained.

Furthermore, a first optical filter was separately produced and a hydrogenated silicon film was then deposited on the other principal surface of the glass substrate opposite to the filter portion. Specifically, a target of silicon was sputtered using argon gas as a carrier gas, thus depositing a silicon film. In doing so, the flow rate of argon gas was set at 150 sccm. The power applied to the target was set at 10 kW. Next, the silicon film was hydrogenated using both hydrogen (H$_2$) gas and argon (Ar) gas as a carrier gas and using RF plasma, thus forming a hydrogenated silicon film. In doing so, the flow rate of hydrogen gas was set at 50 sccm and the flow rate of argon gas was set at 200 sccm. The power applied to the RF plasma was set at 2.5 kW.

Next, a target of silicon was sputtered using both argon gas and oxygen gas as a carrier gas, thus depositing a SiO$_2$ film on the hydrogenated silicon film. In doing so, the flow rate of argon gas was set at 150 sccm and the flow rate of oxygen gas was set at 15 scorn. The power applied to the target was set at 10 kW. During the deposition, the substrate temperature was held at 270° C. By repeating the above operation, an antireflection film was formed in which hydrogenated silicon films and SiO$_2$ films were layered alternately, one layer after another, on the glass substrate and which was composed of 22 layers in total. Thus, a second optical filter designed to function as a bandpass filter and have a central wavelength of 940 nm in a transmission band was obtained. The respective thicknesses of the layers of the second optical filter are as shown in Table 1 below.

TABLE 1

| Filter Portion | | | Antireflection Film | | |
|---|---|---|---|---|---|
| No. | Material | Thickness (nm) | No. | Material | Thickness (nm) |
| | Glass substrate | | 22nd Layer | SiO$_2$ | 35 |
| 1st Layer | SiH | 28 | 21st Layer | SiH | 162 |
| 2nd Layer | SiO$_2$ | 102 | 20th Layer | SiO$_2$ | 49 |
| 3rd Layer | SiH | 306 | 19th Layer | SiH | 147 |
| 4th Layer | SiO$_2$ | 197 | 18th Layer | SiO$_2$ | 60 |
| 5th Layer | SiH | 106 | 17th Layer | SiH | 133 |
| 6th Layer | SiO$_2$ | 79 | 16th Layer | SiO$_2$ | 113 |
| 7th Layer | SiH | 590 | 15th Layer | SiH | 162 |
| 8th Layer | SiO$_2$ | 167 | 14th Layer | SiO$_2$ | 142 |
| 9th Layer | SiH | 99 | 13th Layer | SiH | 89 |
| 10th Layer | SiO$_2$ | 144 | 12th Layer | SiO$_2$ | 143 |
| 11th Layer | SiH | 440 | 11th Layer | SiH | 166 |
| 12th Layer | SiO$_2$ | 27 | 10th Layer | SiO$_2$ | 150 |
| 13th Layer | SiH | 136 | 9th Layer | SiH | 62 |
| 14th Layer | SiO$_2$ | 152 | 8th Layer | SiO$_2$ | 127 |
| 15th Layer | SiH | 251 | 7th Layer | SiH | 62 |
| 16th Layer | SiO$_2$ | 168 | 6th Layer | SiO$_2$ | 61 |
| 17th Layer | SiH | 582 | 5th Layer | SiH | 48 |
| 18th Layer | SiO$_2$ | 95 | 4th Layer | SiO$_2$ | 105 |
| 19th Layer | SiH | 115 | 3rd Layer | SiH | 138 |
| 20th Layer | SiO$_2$ | 267 | 2nd Layer | SiO$_2$ | 105 |
| 21st Layer | SiH | 615 | 1st Layer | SiH | 159 |
| 22nd Layer | SiO$_2$ | 32 | | Glass substrate | |

TABLE 1-continued

| | Filter Portion | | | Antireflection Film | |
|---|---|---|---|---|---|
| No. | Material | Thickness (nm) | No. | Material | Thickness (nm) |
| 23rd Layer | SiH | 145 | | | |
| 24th Layer | $SiO_2$ | 49 | | | |
| 25th Layer | SiH | 330 | | | |
| 26th Layer | $SiO_2$ | 51 | | | |
| 27th Layer | SiH | 118 | | | |
| 28th Layer | $SiO_2$ | 175 | | | |

Ratio ($SiH/SiH_2$):

Separately, a hydrogenated silicon film was deposited on a glass substrate in the same manner as described above and measured in terms of Raman spectrum by Raman spectroscopy. The ratio ($SiH/SiH_2$) determined from the ratio between the area of an obtained SiH-derived peak and the area of an obtained $SiH_2$-derived peak was 1.02.

The Raman spectrum based on Raman spectroscopy was measured with a micro-Raman spectroscope (Product Name "RAMANtouch" manufactured by Nanophoton Corporation). The peak area of each of the SiH-derived peak and the $SiH_2$-derived peak was determined by subjecting each peak to peak fitting processing using Gaussian function and BWF (Breit-Wigner-Fano) function. The peak fitting processing was executed using spectral analysis software (Product Name "RAMAN Viewer" manufactured by Nanophoton Corporation).

Ratio (H/Si):

Separately, a hydrogenated silicon film was deposited on a glass substrate in the same manner as described above and determined in terms of the ratio (H/Si) between the content of hydrogen atoms and the content of silicon atoms. The determined ratio (H/Si) was 0.25.

The content of hydrogen atoms was measured by hydrogen forward scattering spectroscopy. The content of silicon atoms was measured by Rutherford backscattering spectroscopy. The measurements by hydrogen forward scattering spectroscopy and Rutherford backscattering spectroscopy were made in a quantum beam biomolecular dynamic analysis experimental system using a Van de Graaff accelerator (microbeam), model 6SHD-2. The ion beam species used was $O^{4+}$ and the energy was 9 MeV. The tilt of the specimen was 75 degrees as an angle of the normal of the specimen to the axis of incident beam.

The conditions of analysis by hydrogen forward scattering spectroscopy were as follows.

Detector: Si semiconductor detector
Recoil angle: 30 degrees
Stopper foil: 6 μm-thick aluminum
Detector solid angle: 1.4 mSr
Irradiation: 20 μC The conditions of analysis by Rutherford backscattering spectroscopy were as follows.

Detector: Si semiconductor detector
Scattering angle: 165 degrees
Detector solid angle: 0.64 mSr
Irradiation: 20 μC FIG. 4 is a graph showing a bandpass filter characteristic of the first optical filter obtained in Example 1. FIG. 5 is a graph showing a bandpass filter characteristic of the second optical filter obtained in Example 1. In FIGS. 4 and 5, the results at an angle of incidence of 0° are shown by the solid lines and the results at an angle of incidence of 30° are shown by the broken lines.

It can be seen from FIGS. 4 and 5 that, in both the case of using the first optical filter and the case of using the second optical filter, the amount of shift of the central wavelength of the transmission band due to the change of the angle of incidence from 0° to 30° could be reduced to as small as 14 nm. Furthermore, it can be seen from the figures that the second optical filter provided with an antireflection film was equal to the first optical filter in the amount of shift of the central wavelength of the transmission band. On the other hand, it can also be seen that the provision of the antireflection film increased the amount of transmitted light in the transmission band.

Examples 2 to 14 and Comparative Examples 1 and 2

A second optical filter was obtained in the same manner as in Example 1 except that the substrate temperature, the deposition power during deposition of a silicon film, the flow rate of hydrogen ($H_2$) gas during hydrogenation using RF plasma, and the power applied to RF plasma were changed as shown in Table 2 below. In all the above cases, a second optical filter designed to function as a bandpass filter and have a central wavelength of 940 nm in a transmission band at an angle of incidence of 0° was obtained.

The results are shown in Table 2 below, FIG. 6, and FIG. 7. Table 2 collectively shows the ratios ($SiH/SiH_2$) and ratios (H/Si) in the hydrogenated silicon films of the filter portions measured in the same manners as in Example 1. Although in Table 2 and FIGS. 6 and 7 the amount of shift of the central wavelength of the transmission band in each of the second optical filters was determined, it was confirmed that the first optical filters exhibited the same amounts of shift as the corresponding second optical filters.

TABLE 2

| | Si Target | RF Plasma | | | | | Power | Raman Spectrum | | Atomic Weights | | | Amount of Shift |
| | Ar Flow | $H_2$ Flow | Ar Flow | | Substrate | Deposition | for RF | Ratio | | Si | H | | 0-30° |
| | Rate (sccm) | Rate (sccm) | Rate (sccm) | $H_2$/Ar | Temperature (° C.) | Power (kW) | Plasma (kW × 2) | ($SiH/SiH_2$) | 2σ | (at %) | (at %) | (H/Si) | (nm) |
|---|---|---|---|---|---|---|---|---|---|---|---|---|---|
| Ex. 1 | 150 | 50 | 200 | 0.25 | 270 | 10 | 2.5 | 1.02 | 0.06 | 80 | 20 | 0.25 | 14 |
| Ex. 2 | 150 | 50 | 200 | 0.25 | 100 | 10 | 2.5 | 0.72 | 0.08 | 73 | 27 | 0.37 | 15 |

TABLE 2-continued

| | Si Target | RF Plasma | | | Substrate | Deposition | Power for RF | Raman Spectrum | | Atomic Weights | | | Amount of Shift |
| | Ar Flow | H₂ Flow | Ar Flow | | Temperature | Power | Plasma | Ratio (SiH/ | | Si | H | | 0-30° |
| | Rate (sccm) | Rate (sccm) | Rate (sccm) | H₂/Ar | (° C.) | (kW) | (kW × 2) | SiH₂) | 2σ | (at %) | (at %) | (H/Si) | (nm) |
|---|---|---|---|---|---|---|---|---|---|---|---|---|---|
| Ex. 3 | 150 | 25 | 200 | 0.125 | 100 | 10 | 2.5 | 1.03 | 0.04 | 76 | 24 | 0.32 | 14 |
| Ex. 4 | 150 | 10 | 200 | 0.05 | 270 | 15 | 2.5 | 1.48 | 0.10 | 84 | 16 | 0.19 | 12 |
| Ex. 5 | 150 | 25 | 200 | 0.125 | 270 | 15 | 2.5 | 1.54 | 0.08 | 77 | 23 | 0.30 | 13 |
| Ex. 6 | 150 | 50 | 200 | 0.25 | 270 | 15 | 2.5 | 0.92 | 0.08 | 73 | 27 | 0.37 | 14 |
| Ex. 7 | 150 | 75 | 200 | 0.375 | 270 | 15 | 2.5 | 0.86 | 0.09 | 76 | 24 | 0.32 | 14 |
| Ex. 8 | 150 | 100 | 200 | 0.5 | 270 | 15 | 2.5 | 0.86 | 0.08 | 76 | 24 | 0.32 | 14 |
| Ex. 9 | 150 | 25 | 200 | 0.125 | 270 | 15 | 4.0 | 1.03 | 0.07 | 79 | 21 | 0.27 | 14 |
| Ex. 10 | 145 | 10 | 120 | 0.083 | 25 | 5 | 2.5 | 1.28 | 0.11 | — | — | — | 13 |
| Ex. 11 | 165 | 5 | 85 | 0.059 | 25 | 5 | 2.5 | 1.35 | 0.12 | — | — | — | 13 |
| Ex. 12 | 180 | 5 | 55 | 0.091 | 25 | 5 | 2.5 | 1.58 | 0.41 | — | — | — | 11 |
| Ex. 13 | 135 | 10 | 140 | 0.071 | 25 | 5 | 2.5 | 0.97 | 0.14 | — | — | — | 15 |
| Ex. 14 | 170 | 5 | 75 | 0.067 | 25 | 5 | 2.5 | 1.15 | 0.16 | — | — | — | 12 |
| Comp. Ex. 1 | 150 | 50 | 200 | 0.25 | 25 | 10 | 2.5 | 0.52 | 0.07 | 70 | 30 | 0.43 | 16 |
| Comp. Ex. 2 | 150 | 100 | 200 | 0.5 | 100 | 10 | 2.5 | 0.59 | 0.09 | 69 | 31 | 0.45 | 16 |

As shown in Table 2 and FIG. 6, it was confirmed that since the optical filters of Examples 1 to 14 having a ratio (SiH/SiH₂) of 0.7 or more exhibited an amount of shift of the bandpass of 15 nm or less, it can reduce the dependency on the angle of light incidence and can sufficiently transmit even light having a large angle of incidence.

As shown in Table 2 and FIG. 7, it was confirmed that since the optical filters of Examples 1 to 14 having a ratio (H/Si) of 0.4 or less exhibited an amount of shift of the bandpass of 15 nm or less, it can reduce the dependency on the angle of light incidence and can sufficiently transmit even light having a large angle of incidence.

REFERENCE SIGNS LIST 1, 21 . . . optical filter
1a . . . principal surface
2 . . . transparent substrate
2a . . . first principal surface
2b . . . second principal surface
3 . . . filter portion
4, 7 . . . high-refractive index film
5, 8 . . . low-refractive index film
6 . . . antireflection film

The invention claimed is:

1. An optical filter comprising a hydrogenated silicon-containing film, wherein in a Raman spectrum of the hydrogenated silicon-containing film measured by Raman spectroscopy a ratio (SiH/SiH₂) obtained from a ratio between an area of a peak derived from SiH and an area of a peak derived from SiH₂ is 0.7 or more.

2. The optical filter according to claim 1, comprising:
a transparent substrate; and
a filter portion provided on one of both principal surfaces of the transparent substrate and made of a multi-layer including a high-refractive index film with a relatively high refractive index and a low-refractive index film with a relatively low refractive index,
wherein the high-refractive index film is the hydrogenated silicon-containing film.

3. The optical filter according to claim 2, wherein the low-refractive index film is a silicon oxide-containing film.

4. The optical filter according to claim 2, further comprising an antireflection film provided on the other principal surface of the transparent substrate and containing hydrogenated silicon.

5. A method for manufacturing the optical filter according to claim 1, the method comprising the steps of:
depositing a silicon film by sputtering; and
hydrogenating the silicon film after the step of depositing the silicon film.

6. An optical filter comprising a hydrogenated silicon-containing film, wherein a ratio (H/Si) between a content of hydrogen atoms in the hydrogenated silicon-containing film measured by hydrogen forward scattering spectroscopy and a content of silicon atoms in the hydrogenated silicon-containing film measured by Rutherford backscattering spectroscopy is 0.4 or less.

* * * * *